United States Patent
Liang et al.

(10) Patent No.: US 10,998,263 B2
(45) Date of Patent: May 4, 2021

(54) BACK END OF LINE (BEOL) TIME DEPENDENT DIELECTRIC BREAKDOWN (TDDB) MITIGATION WITHIN A VERTICAL INTERCONNECT ACCESS (VIA) LEVEL OF AN INTEGRATED CIRCUIT (IC) DEVICE

(71) Applicant: International Business Machines Corporation, Armonk, NY (US)

(72) Inventors: Jim Shih-Chun Liang, Poughkeepsie, NY (US); Naftali E. Lustig, Croton on Hudson, NY (US); Baozhen Li, South Burlington, VT (US); Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/440,050

(22) Filed: Jun. 13, 2019

(65) Prior Publication Data
US 2020/0395294 A1   Dec. 17, 2020

(51) Int. Cl.
*H01L 23/522* (2006.01)
*H01L 21/768* (2006.01)

(52) U.S. Cl.
CPC .... *H01L 23/5226* (2013.01); *H01L 21/76804* (2013.01); *H01L 21/76807* (2013.01); *H01L 21/76813* (2013.01); *H01L 21/76816* (2013.01); *H01L 21/76831* (2013.01); *H01L 21/76832* (2013.01); *H01L 21/76871* (2013.01)

(58) Field of Classification Search
CPC .......... H01L 21/76829–76834; H01L 21/76802–76807; H01L 21/76816; H01L 23/5226
See application file for complete search history.

(56) References Cited

U.S. PATENT DOCUMENTS 5,879,956 A   3/1999   Seon et al.
6,664,192 B2   12/2003   Satta et al.
(Continued)

FOREIGN PATENT DOCUMENTS

WO   2010064306 A1   6/2010

OTHER PUBLICATIONS

Chan et al., "Post-Routing Back-End-Of-Line Layout Optimization for Improved Time-Dependent Dielectric Breakdown Reliability", UCSD.

*Primary Examiner* — Jose R Diaz
(74) *Attorney, Agent, or Firm* — ZIP Group PLLC

(57) ABSTRACT

An IC device, such as a wafer, chip, die, processor, application specific integrated circuit (ASIC), field programmable gate array (FPGA), or the like include a chamfered VIA that connects an upper wiring line and a first lower wiring line. The chamfered VIA includes a chamfer or fillet upon the edge that connects the VIA sidewall(s) with the VIA contact surface that is connected to the first lower wiring line. The chamfer or fillet effectively increases the amount of a dielectric material, such as a high-k dielectric material, within a trench of the VIA and that is between the chamfered VIA and a second lower wiring line that neighbors the first lower wiring line. This increased dielectric material improves TDDB between the chamfered VIA and the second lower wiring line and mitigates TDDB effects, such as electrical shorts between the chamfered VIA and the second lower wiring line.

12 Claims, 9 Drawing Sheets

(56) References Cited

U.S. PATENT DOCUMENTS

| | | | |
|---|---|---|---|
| 6,905,958 B2 * | 6/2005 | Gracias | B82Y 30/00 257/E21.579 |
| 7,309,658 B2 | 12/2007 | Lazovsky et al. | |
| 7,368,377 B2 * | 5/2008 | Whelan | B82Y 30/00 438/643 |
| 7,790,631 B2 | 9/2010 | Sharma et al. | |
| 7,902,064 B1 | 3/2011 | Chiang et al. | |
| 8,105,947 B2 | 1/2012 | Jeng et al. | |
| 8,404,584 B2 | 3/2013 | Imada et al. | |
| 8,476,765 B2 | 7/2013 | Zhang et al. | |
| 8,557,659 B2 | 10/2013 | Teo | |
| 9,406,615 B2 | 8/2016 | Jezewski et al. | |
| 9,583,557 B2 | 2/2017 | Cheng et al. | |
| 2006/0128142 A1 | 6/2006 | Whelan et al. | |
| 2008/0116481 A1 | 5/2008 | Sharma et al. | |
| 2020/0273794 A1 * | 8/2020 | Khaderbad | H01L 23/5226 |

* cited by examiner

BACK END OF LINE (BEOL) TIME DEPENDENT DIELECTRIC BREAKDOWN (TDDB) MITIGATION WITHIN A VERTICAL INTERCONNECT ACCESS (VIA) LEVEL OF AN INTEGRATED CIRCUIT (IC) DEVICE

FIELD

Embodiments of invention generally relate to integrated circuit (IC) devices and IC device fabrication methods. More particularly, embodiments relate to IC devices with a chamfered VIA between metallization levels to mitigate BEOLTDDB.

BACKGROUND

As the pitch between interconnects and/or wiring features of an IC device decrease, the likelihood of TDDB of dielectric material(s) within the IC device typically increase.

SUMMARY

In an embodiment of the present invention, an integrated circuit (IC) device fabrication method is presented. The method includes forming a lower wiring line within a lower wiring level. The method includes forming an upper wiring line trench and a chamfered vertical interconnect access (VIA) trench within an upper wiring level. The chamfered VIA trench includes a vertical sidewall and a chamfered surface connected to the vertical sidewall. The chamfered VIA trench exposes at least a portion of the lower wiring line there below. The method further includes forming a monolayer upon the exposed portion of the lower wiring line within the VIA trench. The method further includes forming a dielectric film layer upon the vertical sidewall and the chamfered surface within the VIA trench. The method further includes forming a sacrificial plug within the VIA trench upon the dielectric film layer and upon the monolayer. The method further includes removing the sacrificial plug and the monolayer from the VIA trench to re-expose the portion of the lower wiring line while retaining the dielectric film layer upon the vertical sidewall and upon the chamfered surface within the VIA trench. The method further includes forming a chamfered VIA within the chamfered VIA trench at least upon the re-exposed portion of the lower wiring line.

In another embodiment of the present invention, an integrated circuit (IC) device is presented. The device includes a lower wiring line within a lower wiring level. The device includes an upper wiring line and a chamfered vertical interconnect access (VIA) within an upper wiring level. The chamfered VIA connects the upper wiring line and the lower wiring line. The chamfered VIA includes a vertical sidewall, a contact surface facing the lower wiring level and that is connected to the lower wiring line, and a chamfer that connects the vertical sidewall with the contact surface. The device further includes a dielectric film layer upon the vertical sidewall and the chamfered surface between the chamfered VIA and the upper wiring level.

In yet another embodiment of the present invention, an integrated circuit (IC) device fabrication method is presented. The method includes forming a lower wiring line within a lower wiring level. The method further includes forming an upper wiring line trench and a chamfered vertical interconnect access (VIA) trench within an upper wiring level. The chamfered VIA trench includes a vertical sidewall and a chamfered surface connected to the vertical sidewall. The chamfered VIA trench exposes at least a portion of the lower wiring line there below. The method includes forming a monolayer upon the exposed portion of the lower wiring line within the VIA trench. The method further includes forming a dielectric film layer upon the vertical sidewall and the chamfered surface within the VIA trench and within the upper wiring line trench. The method further includes forming a sacrificial plug within the VIA trench upon the dielectric film layer and upon the monolayer. The method further includes removing the sacrificial plug and the monolayer from the VIA trench to re-expose the portion of the lower wiring line while retaining the dielectric film layer upon the vertical sidewall and upon the chamfered surface within the VIA trench. The method further includes forming a chamfered VIA within the chamfered VIA trench at least upon the re-exposed portion of the lower wiring line.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

The drawings are not necessarily to scale. The drawings are merely schematic representations, not intended to portray specific parameters of the invention. The drawings are intended to depict only exemplary embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. These exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of invention generally relate to IC devices, such as wafers, processors, application specific integrated circuits (ASICs), field programmable gate arrays (FPGAs), or the like that include a chamfered VIA that connects an upper wiring line and a first lower wiring line. The chamfered VIA includes a chamfer or fillet upon the edge that connects the VIA sidewall(s) with the VIA contact surface. The VIA sidewall(s) may be vertical or may be angled at the same or different angle relative to the chamfer or fillet. The chamfer or fillet effectively increases the amount of dielectric material between the chamfered VIA and a second lower wiring line that neighbors the first lower wiring line. This increased dielectric material improves TDDB between the chamfered VIA and the second lower wiring line and mitigates TDDB effects, such as electrical shorts between the chamfered VIA and the second lower wiring line.

Figure 1A:
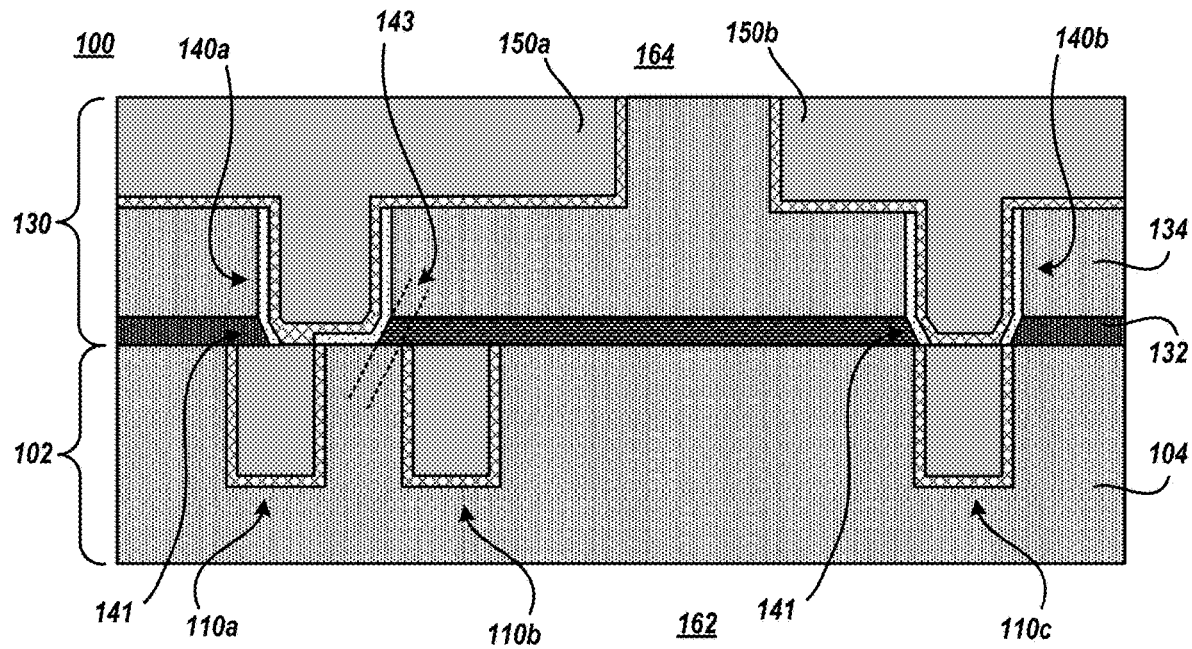
FIG. 1A and FIG. 1B depict cross section views of exemplary IC devices that utilize one or more embodiments of the present invention.
Figure 1B:
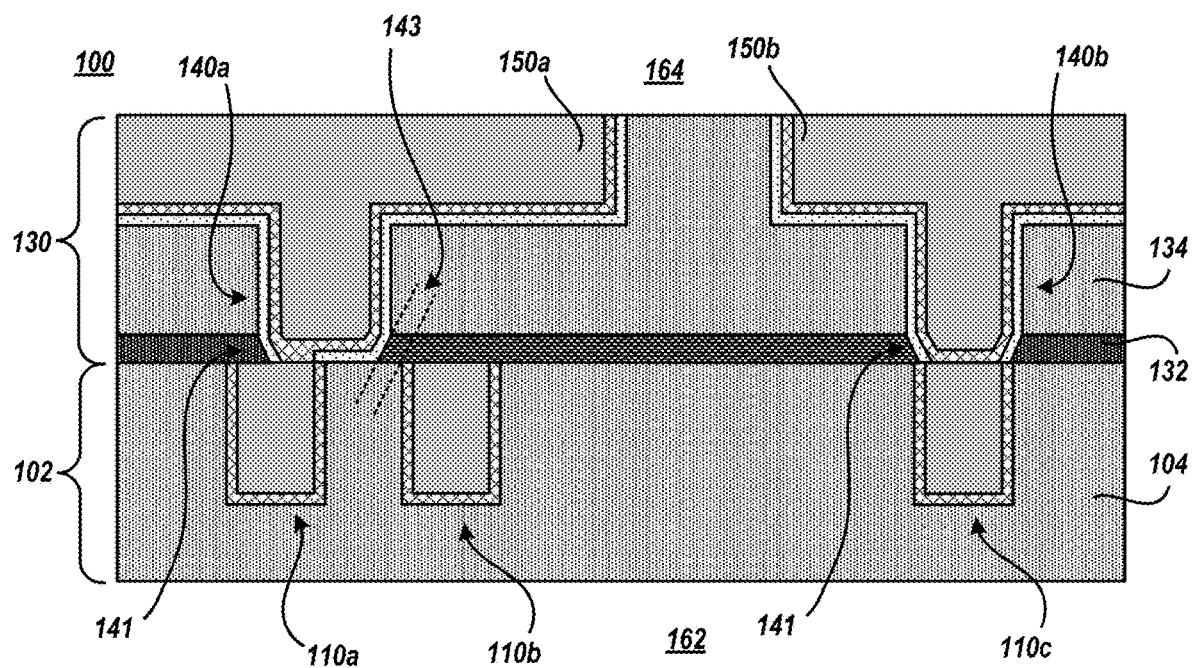

Referring to the FIG. 1A and FIG. 1B, cross section views of an exemplary IC device 100 that utilizes one or more embodiments of the present invention are shown. It should be noted that while this description may refer to some components of the IC device 100 in the singular tense, more than one component may be depicted throughout the figures and like components are labeled with like numerals. Specific elements may be denoted by a numeral and a subscript (e.g. 150a, 110c, etc.). When those elements are referred to generically, merely the numeral is used (e.g. 150, 110, etc.). The specific number of components depicted in the figures and the cross section orientation was chosen for illustrative purposes only.

IC device 100 includes a BEOL wiring level 102 and a BEOL wiring level 130. Below wiring level 102 there may be a lower BEOL wiring level, middle of the line (MOL) structures, and/or front end of the line (FEOL) structures, respectively, as is known in the art. Such structures below wiring level 102 of device 100 may be referred to as lower structure 162. Above wiring level 130 there may be a higher BEOL wiring level, back end structures, and/or advanced packaging structures, respectively, as is known in the art. Such structures above wiring level 130 of device 100 may be referred to as upper structure 164.

Wiring level 102 includes wiring layer 104 and one or more wiring lines 110a, 110b, and/or 110c. Wiring level 130 includes diffusion barrier layer (DBL) 132 and wiring layer 134. Wiring level 130 also includes one or more chamfered VIA 140a and/or chamfered VIA 140b. Wiring level 130 also includes one or more wiring lines 150a and/or 150b. As is exemplarily depicted, chamfered VIA 140a connects wiring line 150a and wiring line 110a and chamfered VIA 140b connects wiring line 150b and wiring line 110c.

The chamfered VIA 140 includes a chamfer or fillet, referred as chamfer 141, upon the edge that connects the sidewall(s) of the chamfered VIA and the surface of the chamfered VIA that is connected to the wiring line in wiring level 102. For example, chamfered VIA 140a includes chamfer 141 upon the edge that connects the sidewall(s) of the chamfered VIA 140a and the surface of the chamfered VIA 140a that is connected to wiring line 110a.

The VIA sidewall(s) and corresponding VIA trench sidewalls are shown in the drawings as being vertical. For clarity, however, these sidewall(s) may be vertical, angled, and/or non-vertical. For example, such sidewall(s) may be angled at the same angle relative to the chamfer or fillet. Further these sidewall(s) may have a vertical portion that is connected to the chamfer or fillet and an angled portion that is connected to the vertical portion. The angled portion may have the same angle or different angle relative to the chamfer or fillet.

The arrangement of the dielectric material within the VIA trench (i.e. upon chamfer 141 and upon the VIA trench sidewalls) increases the amount of dielectric material between the chamfered VIA 140 and a second lower wiring line that neighbors the first lower wiring line in wiring level 102. For example, the chamfer 141 increases the amount of dielectric material between the chamfered VIA 140a and wiring line 110b. In other words, a dimension 143 between, for example, chamfered VIA 140a and wiring line 110b is larger when VIA 140a utilizes the chamfer 141 relative to a same size VIA with no chamfer 141. This increased dielectric material improves TDDB between, for example, the chamfered VIA 140a and wiring line 110b and mitigates TDDB effects, such as, for example, electrical shorts between the chamfered VIA 140a wiring line 110b.

Generally, the term "VIA level," or the like is defined herein to mean the region between conductive wires of immediately adjacent neighboring wiring levels. For example, the depicted exemplary VIA level of device 100 is between the wiring lines 150a, 150b and wiring lines 110a, 110b, 110c.

Figure 2:
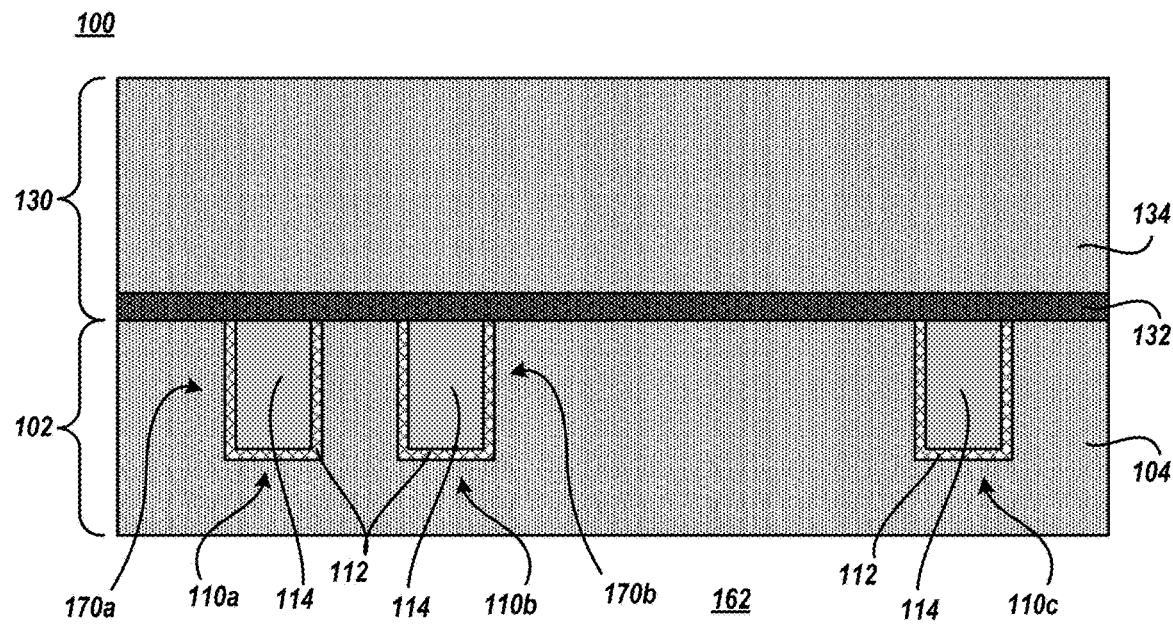
FIG. 2 though FIG. 14 depict cross section views of exemplary IC device fabrication stages, according to various embodiments of the present invention.

Referring now to FIG. 2 though FIG. 14, exemplary process steps of forming IC device 100, in accordance with embodiments of the present invention are shown and will now be described in greater detail below.

FIG. 2 depicts a cross section view of IC device 100 at an intermediate stage of fabrication. At the present fabrication stage, IC device 100 includes wiring level 102, wiring layer 130, one or more wiring lines 110a, 110b, and/or 110c, and lower structure 162.

Wiring level 102 includes wiring layer 104 and one or more wiring lines 110a, 110b, and/or 110c. Wiring layer 104 is generally formed of a dielectric material, such as an oxide, nitride, or the like. In a particular implementation wiring layer 104 is formed of octamethylcyclotetrasiloxane (OMCTS). Wiring layer 104 is formed upon lower structure 162. When wiring level 102 is the first BEOL wiring level (i.e., M1 level), wiring layer 104 is formed upon, for example, middle of the line structure or FEOL structure, as is known in the art. When wiring level 102 is not the first BEOL wiring level (e.g., M2 level, etc.), wiring layer 104 is formed upon, for example, the lower wiring level structure. For example, if wiring level 102 is the M2 BEOL wiring level, wiring layer 104 is formed upon the M1 BEOL wiring level.

One or more wiring line trenches 170a, 170b, 170c, are formed within wiring layer 104, as is known in the art. For example, wiring line trenches 170a, 170b, 170c may be formed by subtractive etching techniques whereby a mask layer is formed upon wiring layer 104, the mask layer is patterned to remove portions of the mask layer which expose underlying portions of the wiring layer 104, portions of the wiring layer 104 are removed with an etchant, thereby forming the wiring line trenches, other portions of wiring layer 104 that are protected by the mask are retained, and finally the mask is removed.

A barrier liner 112 may be formed upon the sidewall(s) and/or lower internal surface of the wiring line trenches 170a, 170b, 170c. For example, a TaN barrier liner 112 may be formed upon the sidewall(s) and lower internal surface of the wiring line trenches 170a, 170b, 170c. A conductive wire 114 may be formed upon the barrier liner 112 within wiring line trenches 170a, 170b, 170c. The conductive wire 114 within each wiring line 110a, 110b, and/or 110c may make contact or otherwise connect with other conductive wiring features there below (e.g. wiring features within wiring level 102 and/or wiring features within lower structure 162) as is known in the art. Conductive wire 114 may be formed by, for example, forming a metal seed layer within the wiring line trench 170 and plating a conductive metal within the wiring line trench 170 consuming the seed layer. In some implementations, a conductive liner layer, such as Cobalt layer, or the like, may be formed between the barrier liner 112 and conductive wire 114. For example, the conductive liner layer may be formed upon the barrier liner 112 and the conductive wire 114 may be formed upon the conductive liner layer.

Prior to forming wiring level 130 thereupon, the wiring level 102 may be planarized such that the upper surfaces of the various structures of wiring level 102 are coplanar.

Wiring level 130 is formed upon wiring level 102 by forming DBL 132 upon the wiring level 102 and forming wiring layer 134 upon DBL 132. For example, DBL 132 is formed upon the upper surface of wiring layer 104, upon the upper surface of wire(s) 114, and upon the upper surface of barrier liner(s) 112. Subsequently, wiring layer 134 is formed upon DBL 132.

The material of DBL 132 and wiring layer 134 may be selected to allow for selectivity of respective material removal. For example, material of DBL 132 and wiring layer 134 may be selected to allow for an etchant to remove portions of wiring layer 134 and stop at or not remove DBL 132. The material of DBL 132 may further be selected to have crystallographic geometry or planes similar to the desired angle of chamfer 141. In a particular implementation, the material of DBL 132 may be $SiN_xC_yH_z$ (NBLoK) and the material of wiring layer 134 is OMCTS.

Figure 3:
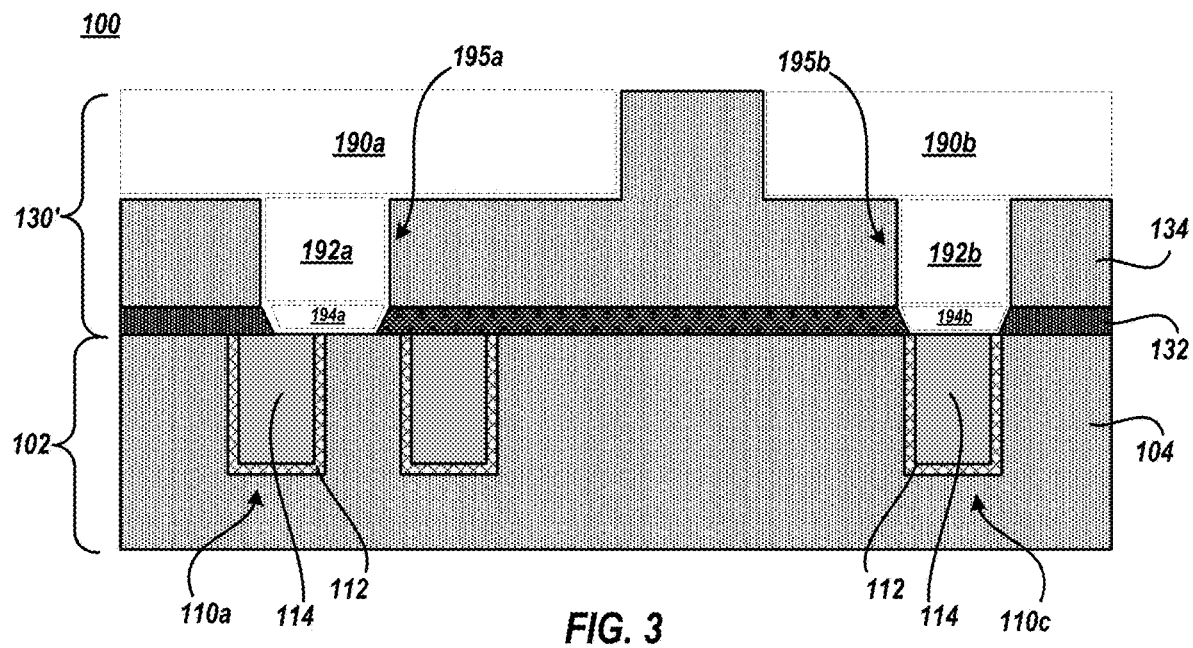

FIG. 3 depicts a cross section view of IC device 100 at an intermediate stage of fabrication. At the present fabrication stage, one or more wiring line trenches 190 and one or more VIA trenches 195 are formed within wiring level 130, thereby forming patterned wiring level 130'.

Patterned wiring level 130' may be formed by sequential subtractive etching techniques. In a first etching sequence, at least one wiring line trench 190a, 190b, may be first formed by forming a mask layer upon wiring layer 134. The mask layer is patterned to remove portions of the mask layer which expose underlying portions of the wiring layer 134. Portions of the wiring layer 134 are removed with an etchant, thereby forming the wiring line trenches 190a, 190b. The etch may be timed to penetrate to a desired depth within wiring layer 134. Other portions of wiring layer 134 that are protected by the mask may be retained.

Subsequently in a next etching sequence, one or more portions 192 of respective VIA trenches 195 are formed. For example, trench portion 192a, 192b, may be formed by forming a mask upon wiring layer 134 within the associated wiring line trench 190a, 190b. The mask layer is patterned to remove portions of the mask layer which expose underlying portions of the wiring layer 134 underneath the associated wiring line trench 190a, 190b. Portions of the wiring layer 134 underneath the associated wiring line trench 190a, 190b are removed with an etchant stopping at DBL 132, thereby forming the trench portion 192a, 192b, respectively. Other portions of wiring layer 134 within the associated wiring line trench 190a, 190b that are protected by the mask may be retained.

In a next etching sequence, one or more portions 194 of respective VIA trenches 195 are formed. For example, an anisotropic etchant may remove material along the crystallographic plane of DBL 132 to create an angled cavity there within, thereby forming portion 194 of VIA trench 195. The etch may be timed or may utilize the upper surface of wiring level 102 as an etch stop. In a particular implementation, the angled face of DBL 132 within VIA portion 194 may be 75 degrees to 85 degrees from the upper surface of wiring level 102. VIA trench portion 194 generally exposes at least a portion of the underlying conductive wire 114. For example, VIA 195a is formed offset from the underlying and associated conductive wire 114 of wire line 110a and a portion of the conductive wire 114 is exposed by VIA trench portion 194a, VIA 195b is formed in line with the underlying and associated conductive wire 114 of wiring line 110c and a portion of the conductive wire 114 is exposed by VIA trench portion 194b, etc.

Figure 4:
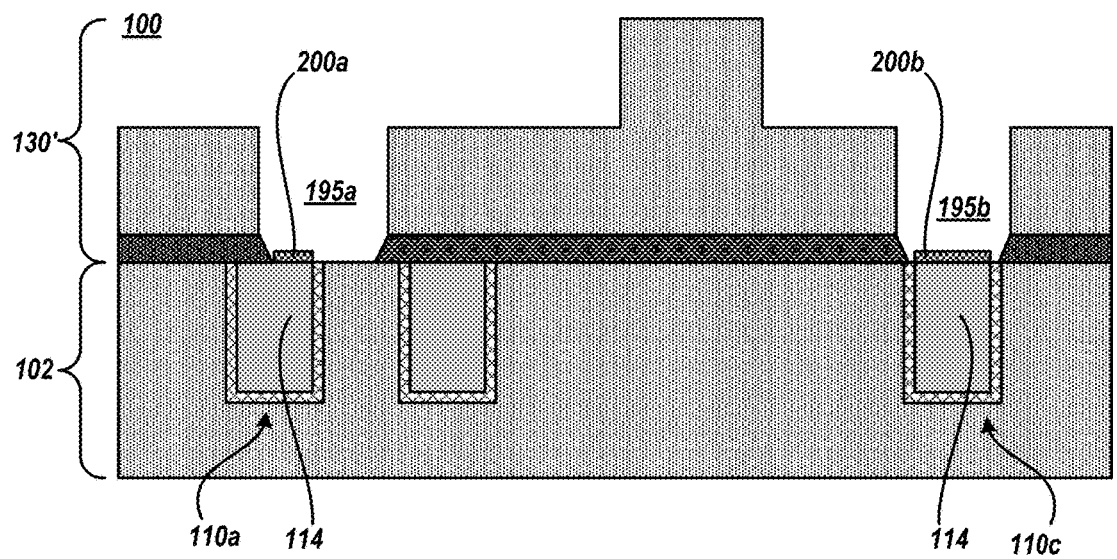

FIG. 4 depicts a cross section view of IC device 100 at an intermediate stage of fabrication. At the present fabrication stage, a monolayer mask 200 is formed upon the exposed portion of the conductive wire 114.

Monolayer mask 200 is a one molecule thick layer and may be formed by immersing IC device 100 in a self-assembled monolayer (SAM) solution. The SAM solution may be Octadecanethiol $CH_3(CH_2)_{16}CH_2SH$ (ODT) if conductive wire 114 has an exposed Cobalt surface, Octadecylphosphponic acid $(OH)_2PO(CH_2)_{17}CH_3$ (ODPA) if conductive wire 114 has an exposed Copper surface. The material of monolayer mask 200 may be selected such that the material of monolayer mask 200 will absorb onto the exposed portion of conductive wire 114 selective to the respective materials of wiring layer 143, DBL 132, barrier liner 112, etc. For example, if wiring layer 143, DBL 132, and barrier liner 112 are all formed from oxides, the material of monolayer mask 200 may be selected such that the material of monolayer mask 200 will absorb onto the exposed portion of conductive wire 114 selective to oxide, such that monolayer mask 200 may be formed solely upon the exposed portion of conductive wire 114.

In the depicted exemplary IC device 100, monolayer mask 200a is formed upon the exposed portion of the conductive wire 114 of wire line 110a and monolayer mask 200b is formed upon the exposed portion of the conductive wire 114 of wiring line 110c.

Figure 5:
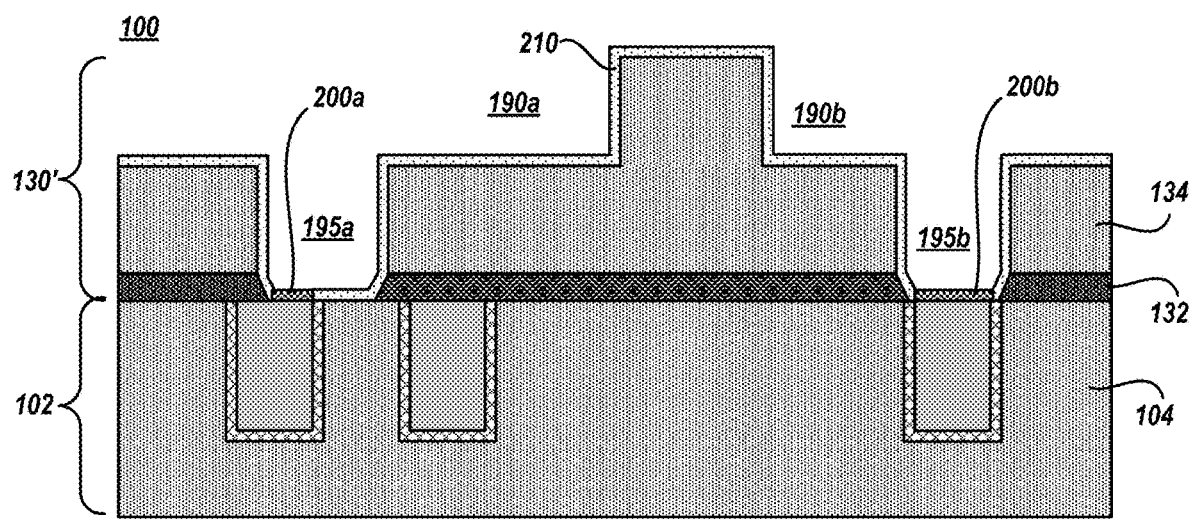

FIG. 5 depicts a cross section view of IC device 100 at an intermediate stage of fabrication. At the present fabrication stage, a dielectric film layer 210 is formed upon the pattern wiring layer 130'.

Dielectric film layer 210 is a dielectric material film, such as an oxide, nitride, or high-k (i.e., a material with a dielectric constant higher than that of silicon dioxide) material. The material of dielectric film layer 210 may be chosen such that the material of dielectric film layer 210 will not form upon monolayer mask 200. For example, atomic layer deposition (ALD) formed dielectric may not form upon monolayer mask 200 because associated ALD precursors do not bond to the hydrophobic CH chain of the monolayer mask 200.

Dielectric film layer 210 is formed at least upon the surfaces of VIA trench 195. For example, if the VIA trench 195 is offset from the underlying wiring line such as that depicted by VIA trench 195a, dielectric film layer 210 is at least formed upon the wiring layer 134 material sidewall(s) of VIA trench 195a, upon the DBL 132 chamfered wall(s) of VIA trench 195a, and upon the upper surface of barrier liner 112 and wiring layer 104 that are exposed by VIA trench 195a. Likewise, if the VIA trench 195 is in line with the underlying wiring line such as that depicted by VIA trench 195b, dielectric film layer 210 is at least formed upon the wiring layer 134 material sidewall(s) of VIA trench 195b and upon the DBL 132 chamfered wall(s) of VIA trench 195b.

The dielectric film layer 210 may further be formed upon wiring layer 134 surfaces above the VIA level, such as depicted. For example, the dielectric film layer 210 may be formed upon the wiring trench(s) 190 surfaces, upon the upper surface of wiring layer 134, etc.

For clarity, though the thickness of dielectric film layer 210 and monolayer mask 200 are depicted as similar, the thickness of monolayer mask 200 may be less than the thickness of dielectric film layer 210.

Figure 6:
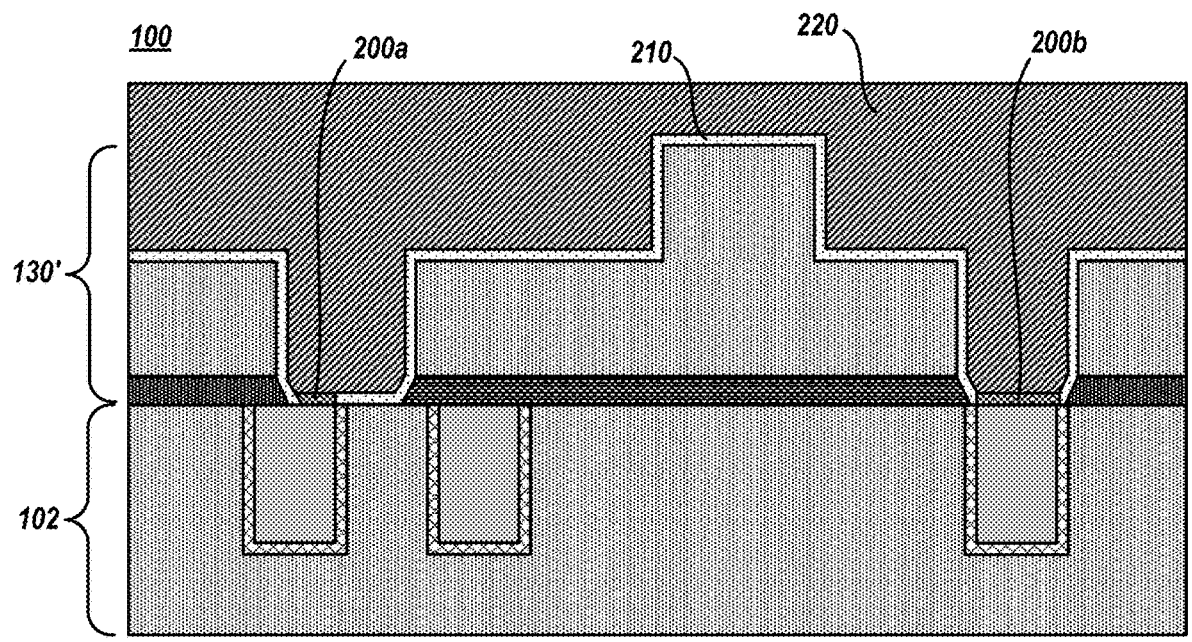

FIG. 6 depicts a cross section view of IC device 100 at an intermediate stage of fabrication. At the present fabrication stage, a planarization layer 220 is formed upon patterned wiring layer 130'.

Planarization layer 220 may be formed upon dielectric film layer 210 and upon the monolayer mask 200 within VIA trench 190 and may be formed upon wiring layer 134 surfaces there above, if dielectric film layer 210 and monolayer mask 200 are formed merely within VIA trench 190. If dielectric film layer 210 is formed within the VIA trench 190 and upon wiring layer 134 surfaces above the VIA level, such as depicted, planarization layer 220 may be formed upon dielectric film layer 210 and upon monolayer mask 200.

Planarization layer 220 may be an organic dielectric material and may be a blanket layer formed to a thickness greater that the thickness of the patterned wiring layer 130'.

Figure 7:
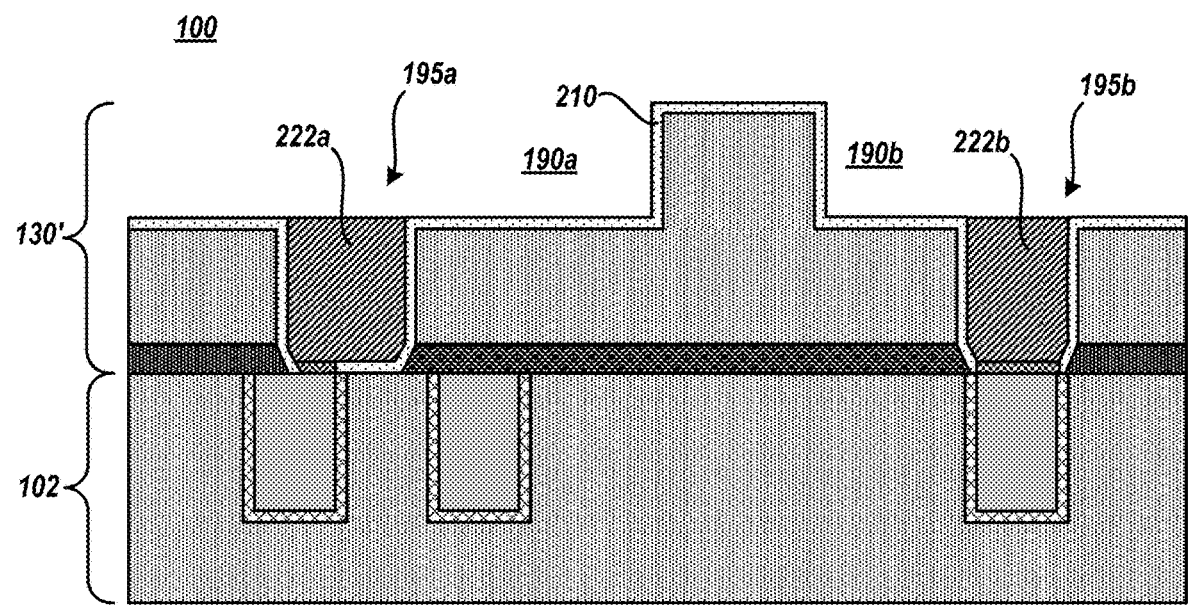

FIG. 7 depicts a cross section view of IC device 100 at an intermediate stage of fabrication. At the present fabrication stage, planarization layer 220 is partially removed by removing planarization layer 220 above wiring layer 134, removing planarization layer 220 within wiring trench 190, and retained planarization layer 220 within VIA trench 195.

Planarization layer 220 may be partially removed by ashing back the planarization layer 220 material. For example, a $N_2$ or $H_2$ gas mixture may be utilized to ash back or remove the planarization layer 220 above wiring layer 134, to ash back or remove the planarization layer 220 within wiring trench 190. The ash treatment may be timed, stopped, or otherwise controlled to retain the planarization layer 220 within VIA trench 195.

Figure 8:
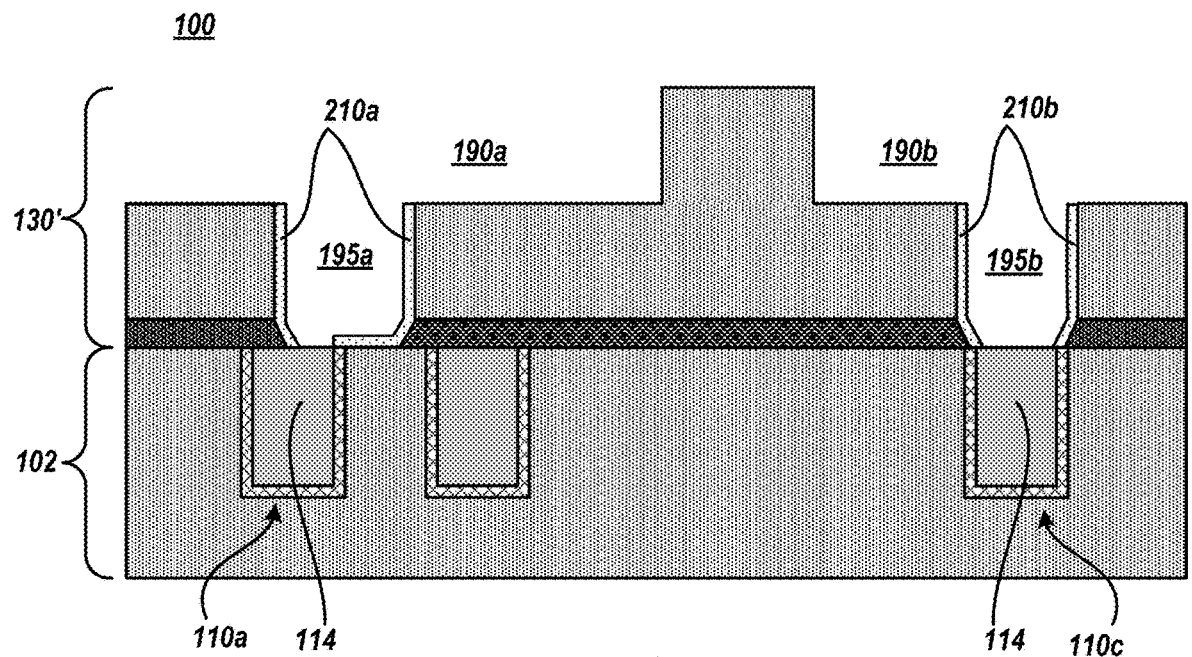

FIG. 8 depicts a cross section view of IC device 100 at an intermediate stage of fabrication. At the present fabrication stage, dielectric film layer 210 is removed from the wiring trench 190 surfaces and is retained in the VIA trench 195 surfaces and the planarization layer 220 and the mask 200 is removed from within the VIA trench 195.

Dielectric film layer 210 may be removed from the wiring trench 190 surfaces and may be retained in the VIA trench 195 surfaces by subtractive etching techniques whereby an etchant removes the exposed dielectric film layer 210 material from within the wiring trench 190 surfaces and from the upper surface of wiring layer 134. The planarization layer 220 within the VIA trench 195 protects the dielectric film layer 210 from being removed within the VIA trench 195 such that the dielectric film layer 210 is retained in the VIA trench 195.

Subsequently, planarization layer 220 and the mask 200 may be removed from within the VIA trench 195. For example, the planarization layer 220 and the mask 200 are removed from within the VIA trench 195 by ashing back the planarization layer 220 material and the mask 200 material within the VIA trench 195. For example, a $N_2$ or $H_2$ gas mixture may be utilized to ash back or remove the planarization layer 220 and mask 200. The removal of the planarization layer 220 and the mask 200 generally exposes the upper surface of the associated conductive wiring 114 there below.

Figure 9:
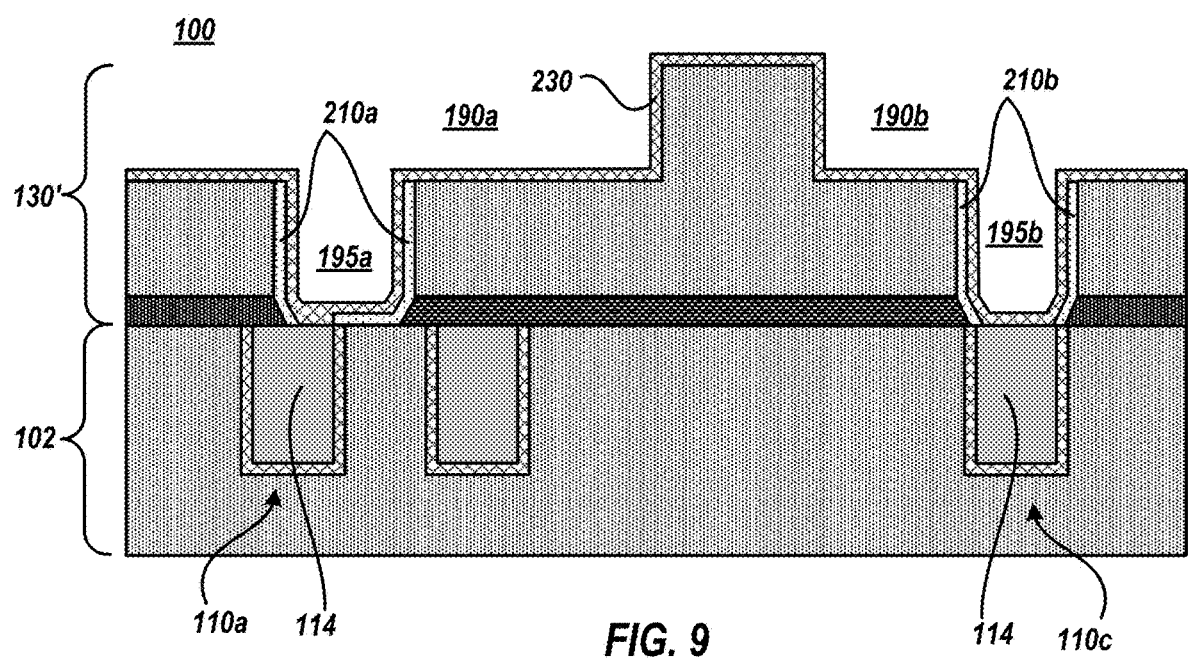

FIG. 9 depicts a cross section view of IC device 100 at an intermediate stage of fabrication. At the present fabrication stage, barrier liner 230 is formed upon the patterned wiring level 130'.

The barrier liner 230 may be formed upon the upper surfaces of the patterned wiring layer 134, upon the dielectric film layer 210 within VIA trench 195, upon the exposed conductive wiring 114 within the VIA trench 195, and upon the wiring trench 190 lower surface and sidewalls. For example, barrier liner 230 may be formed upon the upper surface of the patterned wiring layer 134 at the top or upper side of the patterned wiring level 130. Barrier liner 230 may be further formed upon the dielectric film layer 210a within VIA trench 195a, upon the exposed conductive wiring 114 within the VIA trench 195a, and upon the wiring trench 190a lower surface and sidewalls. Barrier liner 230 may be further formed upon the dielectric film layer 210b within VIA trench 195b, upon the exposed conductive wiring 114 within the VIA trench 195b, and upon the wiring trench 190b lower surface and sidewalls.

Figure 10:
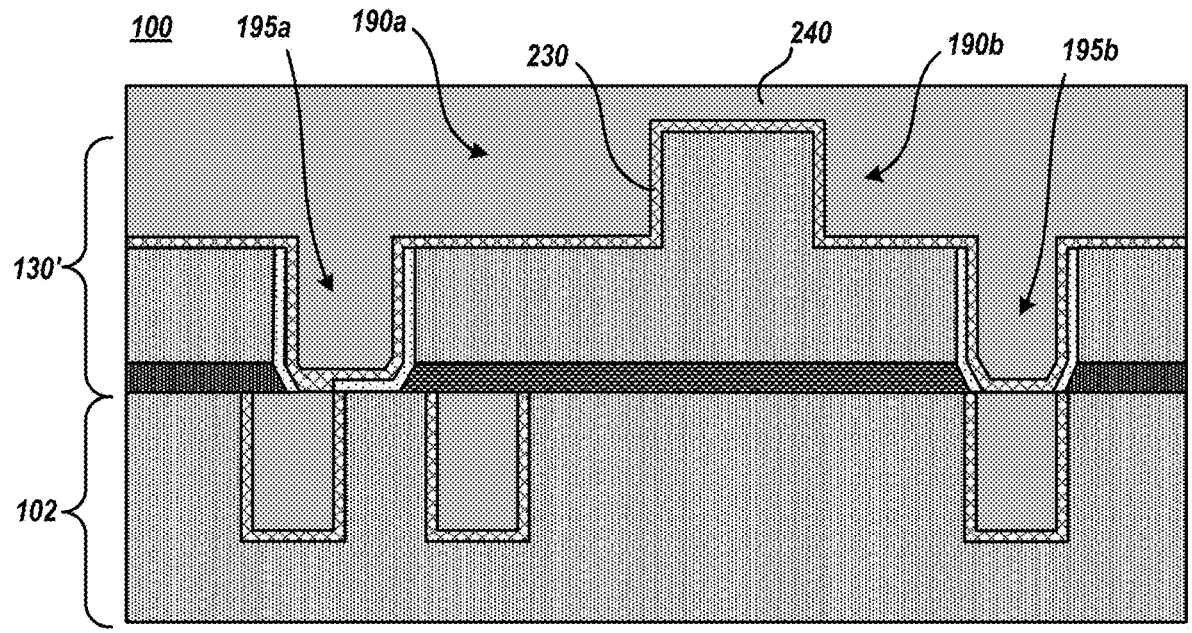

FIG. 10 depicts a cross section view of IC device 100 at an intermediate stage of fabrication. At the present fabrication stage, a conductive wiring blanket layer 240 is formed upon the patterned wiring level 130'.

Conductive wiring blanket layer 240 may be formed by, for example, forming a metal seed layer upon the patterned wiring level 130' and plating a conductive metal upon the patterned wiring level consuming the seed layer. For example, conductive wiring blanket layer 240 may be formed by plating conductive metal, such as copper, upon the barrier liner 230.

In some implementations, a conductive liner layer, such as Cobalt layer, or the like, may be formed between the barrier liner 230 and conductive wiring blanket layer 240. For example, the conductive liner layer may be formed upon the barrier liner 230 and the conductive wiring blanket layer 240 may be formed upon the conductive liner layer.

Figure 11:
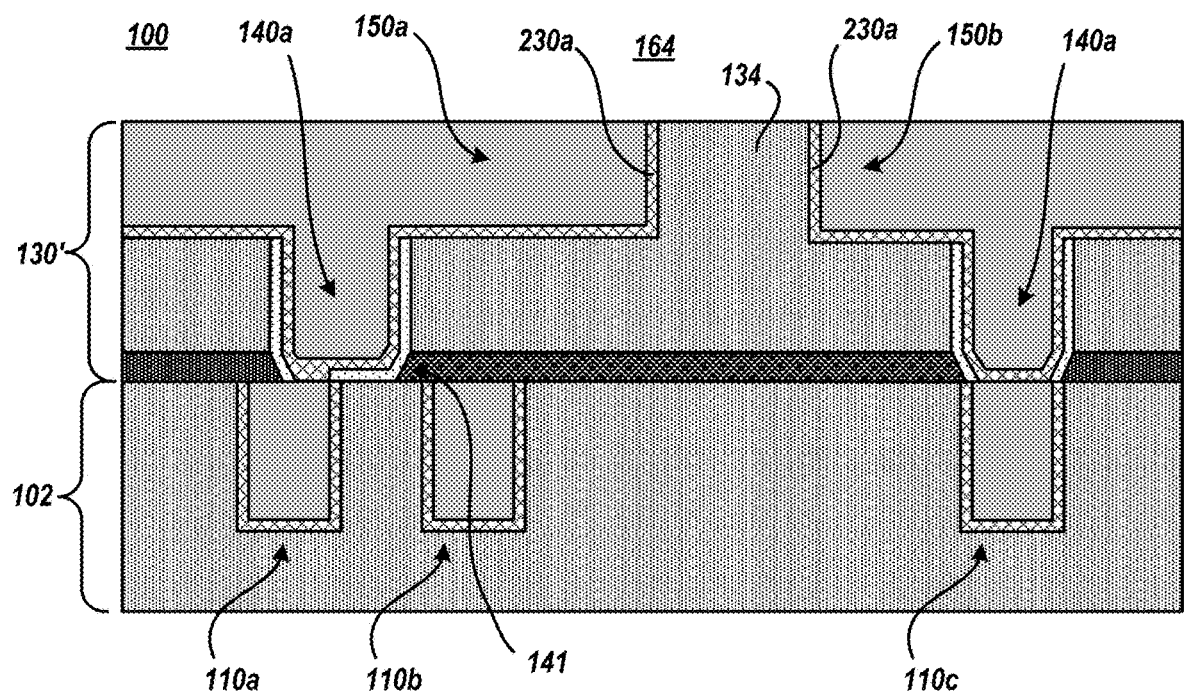

FIG. 11 depicts a cross section view of IC device 100 at an intermediate stage of fabrication. At the present fabrication stage, the conductive wiring blanket layer 240 is planarized with the top surface of wiring layer 134, thereby forming wiring 150 and VIA 140.

The conductive wiring blanket layer 240 may be planarized by a chemical mechanical polish (CMP) that removes excess material above the top surface of wiring layer 134. In other words, the wiring level 130 may be planarized by the CMP such that appropriate upper surfaces of the various structures of wiring level 130 are coplanar with the upper surface of wiring layer 134. By removing excess conductive wiring blanket layer 240, wiring line 150 is formed within the wiring trench 190 and VIA 140 is formed within the VIA trench 195. For example, wiring line 150a is formed within the wiring trench 190a and VIA 140a is formed within the VIA trench 195a and wiring line 150b is formed within the wiring trench 190b and VIA 140b is formed within the VIA trench 195b.

IC device 100 may undergo further fabrication stages to form at least upper structure 164. For example, another BEOL wiring level may be formed upon the structure depicted in FIG. 11, back end structures may be formed, and/or advanced packaging structures may be formed, respectively, as is known in the art.

In the present embodiment, IC device has been fabricated to form at least the chamfered VIA 140b includes a chamfer or fillet, referred as chamfer 141, upon the edge that connects the sidewall(s) of the chamfered VIA and the surface of the chamfered VIA that is connected to the wiring line 110a. The chamfer 141 increases the amount of dielectric material between the chamfered VIA 140a and wiring line 110b. Further, when a high-k dielectric material is utilized, dielectric film layer 210 further improves electrical isolation or insulation. This increased dielectric material improves TDDB between, for example, the chamfered VIA 140a and wiring line 110b and mitigates TDDB effects, such as, for example, electrical shorts between the chamfered VIA 140*a* wiring line 110*b*. Further, when dielectric film layer 210 is merely within the VIA, increased TDDB mitigation may be achieved without significantly increasing capacitance of the structure 100.

In an implementation, a vertical sidewall of the chamfered VIA 140*a* may be entirely within the wiring layer 134 and the chamfer 141 of the chamfered VIA 140*a* may be entirely within the DBL 132.

Figure 12:
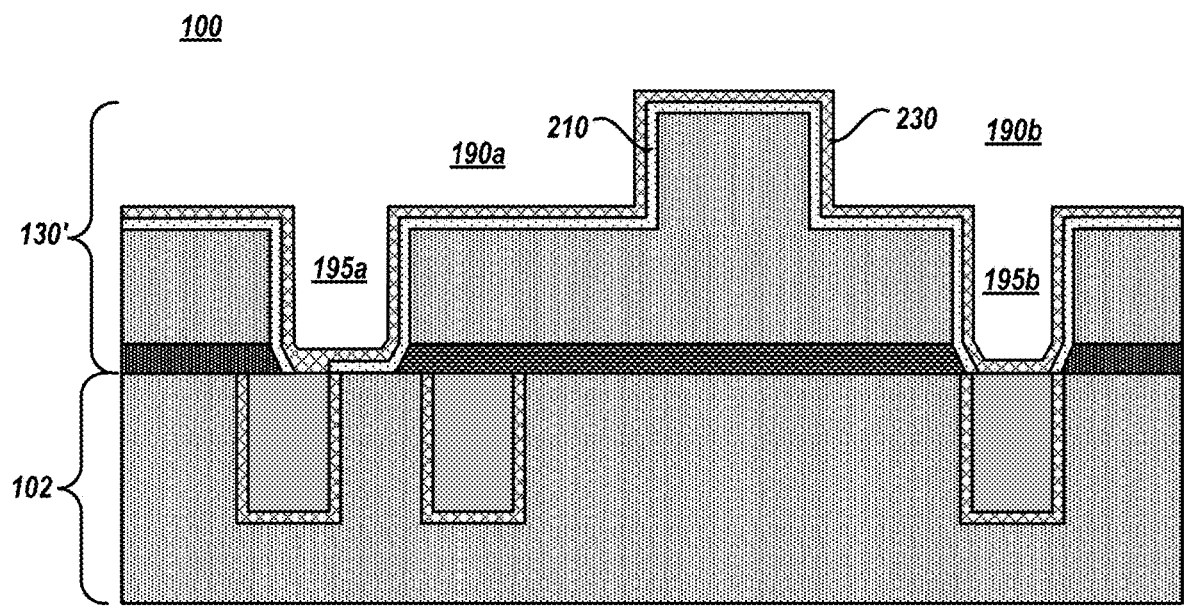
Figure 13:
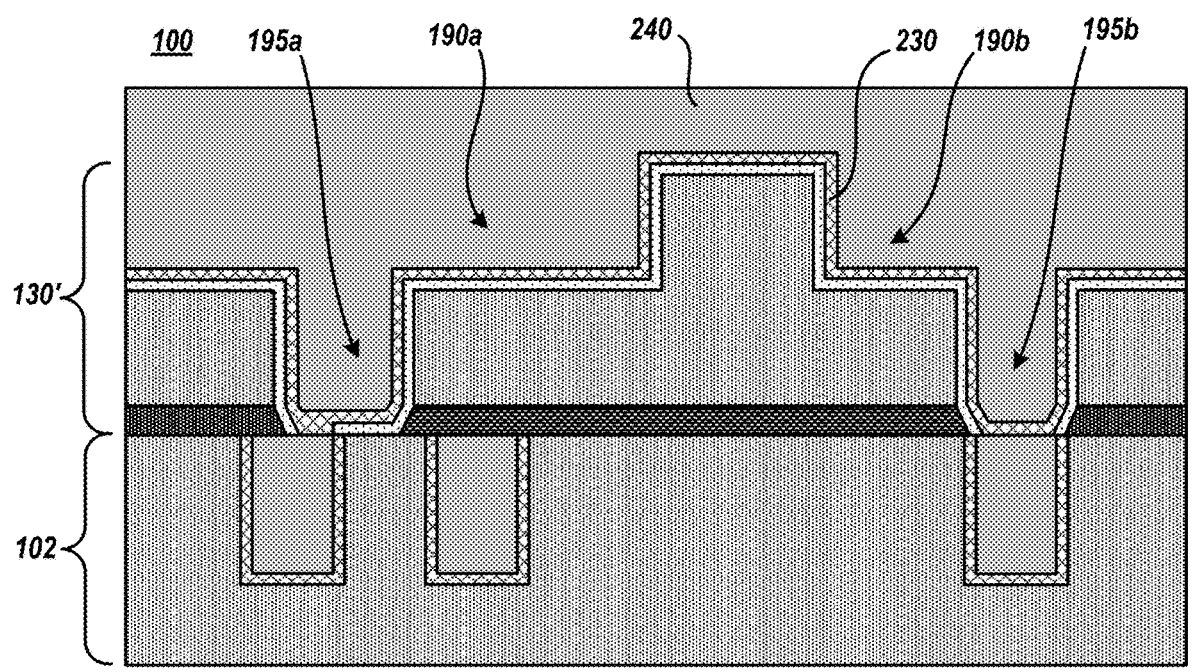
Figure 14:
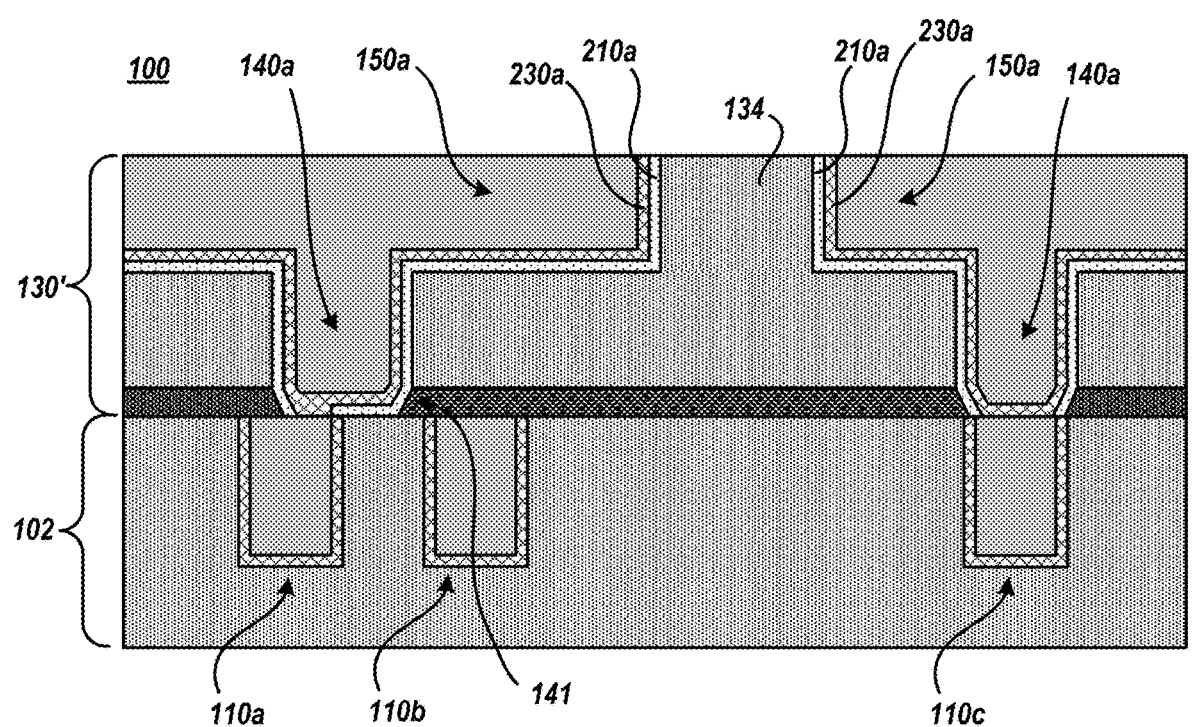

FIG. 12 through FIG. 14 depict an embodiment of fabrication stages that retain dielectric film layer 210 in the VIA trench 195 and in the wiring trench 190. The fabrication stages shown in FIG. 12 through FIG. 14 may continue from the fabrication stage depicted from that shown in FIG. 5.

FIG. 12 depicts a cross section view of IC device 100 at an intermediate stage of fabrication. At the present fabrication stage, barrier liner 230 is formed upon the patterned wiring level 130'.

The barrier liner 230 may be formed upon the dielectric film layer 210 and upon the exposed conductive wiring 114 within the VIA trench 195. For example, barrier liner 230 may be formed upon the dielectric film layer 210 within VIA trench 195*a*, upon the exposed conductive wiring 114 within the VIA trench 195*a*, and upon the dielectric film layer 210 within wiring trench 190*a*. Barrier liner 230 may be further formed upon the dielectric film layer 210 within VIA trench 195*b*, upon the exposed conductive wiring 114 within the VIA trench 195*b*, and upon the dielectric film layer 210*b* within wiring trench 190*b*. Barrier liner 230 may be further formed upon dielectric film layer 210 upon the upper surface of wiring layer 134.

FIG. 13 depicts a cross section view of IC device 100 at an intermediate stage of fabrication. At the present fabrication stage, a conductive wiring blanket layer 240 is formed upon the patterned wiring level 130'.

Conductive wiring blanket layer 240 may be formed by, for example, forming a metal seed layer upon the patterned wiring level 130' and plating a conductive metal upon the patterned wiring level consuming the seed layer. For example, conductive wiring blanket layer 240 may be formed by plating conductive metal, such as copper, upon the barrier liner 230.

In some implementations, a conductive liner layer, such as Cobalt layer, or the like, may be formed between the barrier liner 230 and conductive wiring blanket layer 240. For example, the conductive liner layer may be formed upon the barrier liner 230 and the conductive wiring blanket layer 240 may be formed upon the conductive liner layer.

FIG. 14 depicts a cross section view of IC device 100 at an intermediate stage of fabrication. At the present fabrication stage, the conductive wiring blanket layer 240 is planarized with the top surface of wiring layer 134, thereby forming wiring 150 and VIA 140.

The conductive wiring blanket layer 240 may be planarized by a chemical mechanical polish (CMP) that removes excess material above the top surface of wiring layer 134. In other words, the wiring level 130 may be planarized by the CMP such that appropriate upper surfaces of the various structures of wiring level 130 are coplanar with the upper surface of wiring layer 134. By removing excess conductive wiring blanket layer 240, wiring line 150 is formed within the wiring trench 190 and VIA 140 is formed within the VIA trench 195. For example, wiring line 150*a* is formed within the wiring trench 190*a* and VIA 140*a* is formed within the VIA trench 195*a* and wiring line 150*b* is formed within the wiring trench 190*b* and VIA 140*b* is formed within the VIA trench 195*b*.

By removing excess dielectric film layer 210, dielectric film layer 210*a* is formed within the wiring trench 195*a* and within the VIA trench 195*a* and dielectric film layer 210*b* is formed within the wiring trench 195*b* and within the VIA trench 195*b*. Similarly, by removing excess barrier liner 230, barrier liner 230*a* is formed within the wiring trench 195*a* and within the VIA trench 195*a* and barrier liner 230*b* is formed within the wiring trench 195*b* and within the VIA trench 195*b*.

IC device 100 may undergo further fabrication stages to form at least upper structure 164. For example, another BEOL wiring level may be formed upon the structure depicted in FIG. 11, back end structures may be formed, and/or advanced packaging structures may be formed, respectively, as is known in the art.

In the present embodiment, IC device has retained dielectric film layer 210*a* and dielectric film layer 210*b* within the respective wiring trenches 190*a*, 190*b*. The added dielectric material may mitigate TDDB effects due to the relatively increased amount of dielectric material between wiring lines 150*a* and 150*b*, such as shorting between wiring lines 150*a* and 150*b*. Further, when dielectric film layer 210 is a high-k material, TDDB effects may further be limited due to the increased electrical isolation or insulative properties of such materials.

Further in the present embodiment, IC device has been fabricated to form at least the chamfered VIA 140*a* includes a chamfer 141, upon the edge that connects the sidewall(s) of the chamfered VIA 140*a* and the connection surface of the chamfered VIA that is connected to the wiring line 110*a*. The chamfer 141 increases the amount of dielectric material between the chamfered VIA 140*a* and wiring line 110*b*. This increased dielectric material improves TDDB between, for example, the chamfered VIA 140*a* and wiring line 110*b* and mitigates TDDB effects, such as, for example, electrical shorts between the chamfered VIA 140*a* wiring line 110*b*.

Figure 15:
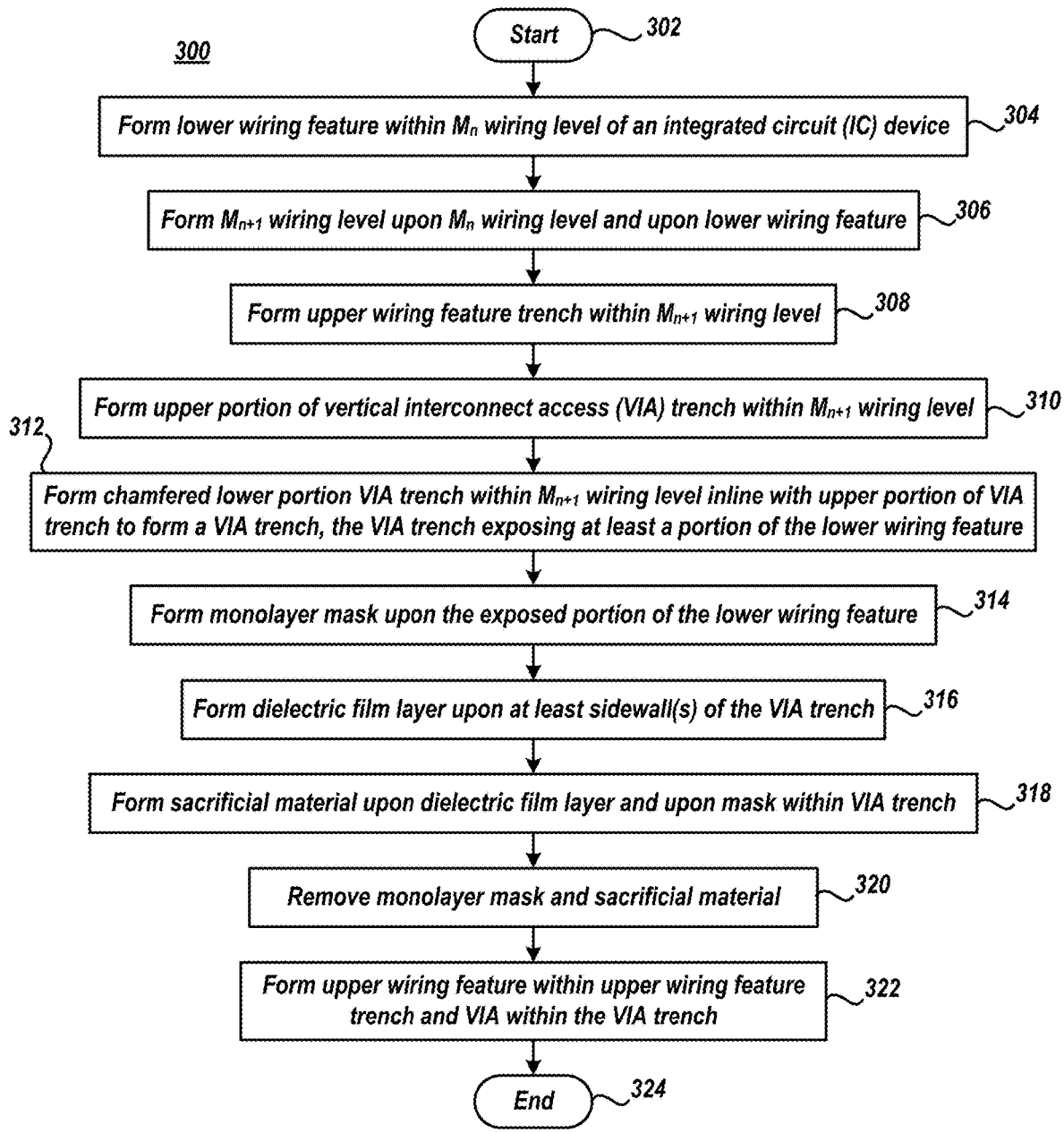
FIG. 15 depicts a method of exemplary fabrication process stages, in accordance with various embodiments of the present invention.

FIG. 15 depicts an exemplary fabrication method 300 for manufacturing an integrated circuit (IC) device, in accordance with various embodiments of the present invention. Method 300 begins at block 302 and continues with forming a lower wiring feature within an $M_n$ wiring level of an IC device (block 304). For example, a wiring line 110*a* is formed within wiring layer 104 to form wiring level 102 of IC device 100.

Method 300 may continue with forming a $M_{n+1}$ wiring level upon the $M_n$ wiring level and upon the lower wiring feature (block 306). For example, DBL 132 is formed upon wiring layer 104 and formed upon wiring line 110*a*; and wiring layer 134 is formed upon DBL 132 to form wiring level 130 that is upon wiring level 102.

Method 300 may continue with forming an upper wiring feature trench within the $M_{n+1}$ wiring level (block 308). For example, a wiring line trench 190*a* is formed within wiring layer 134. Method 300 may continue forming an upper portion of a VIA trench within the $M_{n+1}$ wiring level (block 310). For example, a VIA trench portion 192*a* is formed from within the wiring line trench 190*a* of wiring layer 134.

Method 300 may continue forming a chamfered lower portion VIA trench within the $M_{n+1}$ wiring level in line with the upper portion of a VIA trench (block 312). The lower portion of the VIA trench exposes at least a portion of the conductive wiring of the lower wiring feature. For example, a chamfered VIA trench portion 194*a* is formed inline with VIA trench portion 192*a* within wiring layer 134 and exposes at least a portion of the conductive wiring 114 of the lower wiring feature 110*a*. The chamfered VIA trench portion 194*a* and the VIA trench portion 192*a* generally form the VIA trench 195a. The chamfered lower portion VIA trench is formed to add a chamfered or angled surface to the VIA trench 195a at the location of the edge that would otherwise connect the lower surface of the VIA trench 195a with the sidewall(s) of the VIA trench 195a.

Method 300 may continue with forming a monolayer mask upon the exposed portion of the lower wiring feature (block 314). For example, monolayer mask 200a is selectively formed only upon the portion of the conductive wire 114 of wire line 110a that is exposed by VIA trench 195a.

Method 300 may continue with forming a dielectric film layer upon at least the sidewall(s) of the VIA trench (block 316). For example, dielectric film layer 210b is formed upon at least the vertical sidewall(s) of the VIA trench portion 192b and upon the chamfered surface of the VIA trench portion 194b. If the VIA trench 195a is offset from the wiring line 110a there below, the dielectric film layer 210a may be formed upon the vertical sidewall(s) of the VIA trench portion 192a, upon the chamfered surface of the VIA trench portion 194a, and upon the exposed upper surface(s) of wiring level 102 exposed by the VIA trench 195a.

Method 300 may continue with forming sacrificial material, which may be referred herein as a sacrificial plug, upon the dielectric film layer and upon the monolayer mask within the VIA trench (block 318). For example, sacrificial material 222a is formed within the VIA trench 195a upon the dielectric film layer 210a and upon the monolayer mask 200a.

Method 300 may continue with removing the sacrificial material and the monolayer mask from within the VIA trench and retaining the dielectric film layer within the VIA trench (block 320). For example, the sacrificial material may be initially removed from within the VIA trench and the monolayer mask is then subsequently removed from within the VIA trench. Alternatively, the sacrificial material and the monolayer mask may be simultaneously removed from within the VIA trench. For example, the sacrificial material 222a and the monolayer mask 200a is simultaneously removed from within the VIA trench 195a and the dielectric film layer 210a is retained within the VIA trench 195a (block 320).

Method 300 may continue with forming a conductive upper wiring feature within the upper wiring feature trench and forming a VIA within the VIA trench (block 322). For example, a VIA 140a is formed within the VIA trench 195a and a wiring line 150a is formed within the wiring line trench 190a. Method 300 may end at block 324.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

Unless described otherwise or in addition to that described herein, "forming" or the like, may include any now known or later developed techniques appropriate for the material to be fabricated, including, but not limited to: CVD, LPCVD, PECVD, semi-atmosphere CVD (SACVD), high density plasma CVD (HDPCVD), rapid thermal CVD (RT-CVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

References herein to terms such as "vertical", "horizontal", etc. are made by way of example, and not by way of limitation, to establish a frame of reference. The term "horizontal" as used herein is defined as a plane parallel to the conventional plane or surface of the wiring level, regardless of the actual spatial orientation of the IC device. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The invention claimed is:

1. An integrated circuit (IC) device fabrication method comprising:
    forming a first lower wiring line and a second wiring line within a lower wiring layer;
    forming a diffusion barrier layer upon the lower wiring layer;
    forming an upper wiring layer upon the diffusion barrier layer;
    forming an upper wiring line trench by etching away a first portion of the upper wiring layer;
    forming a chamfered vertical interconnect access (VIA) trench by etching away a second portion of the upper wiring layer stopping upon an upper surface of the diffusion barrier layer and subsequently etching away a portion of the diffusion barrier layer stopping upon an internal angled plane of the diffusion barrier layer, the chamfered VIA trench comprising a vertical sidewall of the upper wiring layer and a chamfered surface of the diffusion barrier layer connected to the vertical sidewall, the chamfered VIA trench exposing at least a portion of the first lower wiring line and a portion of the lower wiring layer between the first wiring line and the second wiring line there below;
    selectively forming a monolayer solely upon the exposed portion of the first lower wiring line within the chamfered VIA trench;
    forming a dielectric film layer upon the vertical sidewall, upon the chamfered surface within the chamfered VIA trench, and upon the portion of the lower wiring layer between the first wiring line and the second wiring line;

removing the monolayer from the chamfered VIA trench to re-expose the portion of the first lower wiring line while retaining the dielectric film layer upon the vertical sidewall, upon the chamfered surface within the VIA trench, and upon the portion of the lower wiring layer between the first wiring line and the second wiring line, wherein removing the monolayer from the chamfered VIA trench comprises forming a sacrificial plug upon the dielectric film layer and upon the monolayer within the chamfered VIA trench and simultaneously removing the sacrificial plug and monolayer from the chamfered VIA trench;

forming a chamfered VIA within the chamfered VIA trench upon the re-exposed portion of the first lower wiring line and upon the portion of the lower wiring layer between the first wiring line and the second wiring line.

2. The fabrication method of claim 1, wherein the chamfered VIA comprises a vertical sidewall, a contact surface connected to the re-exposed portion of the first lower wiring line and connected to the portion of the lower wiring layer between the first wiring line and the second wiring line, and a chamfer that connects the vertical sidewall with the contact surface.

3. The fabrication method of claim 1, further comprising:
forming an upper wiring line within the upper wiring line trench, wherein the chamfered VIA connects the first lower wiring line and the upper wiring line.

4. The fabrication method of claim 1, wherein the chamfered VIA is offset from the first lower wiring line.

5. The fabrication method of claim 1, wherein the chamfered VIA is in line with the first lower wiring line.

6. The fabrication method of claim 1, wherein the monolayer is a one molecule thick layer.

7. An integrated circuit (IC) device fabrication method comprising:
forming a first lower wiring line and a second wiring line within a lower wiring layer;
forming a diffusion barrier layer upon the lower wiring layer;
forming an upper wiring layer upon the diffusion barrier layer;
forming an upper wiring line trench by etching away a first portion of the upper wiring layer;
forming a chamfered vertical interconnect access (VIA) trench by etching away a second portion of the upper wiring layer stopping upon an upper surface of the diffusion barrier layer and subsequently etching away a portion of the diffusion barrier layer stopping upon an internal angled plane of the diffusion barrier layer, the chamfered VIA trench comprising a vertical sidewall of the upper wiring layer and a chamfered surface of the diffusion barrier layer connected to the vertical sidewall, the chamfered VIA trench exposing at least a portion of the first lower wiring line and a portion of the lower wiring layer between the first wiring line and the second wiring line there below;

selectively forming a monolayer solely upon the exposed portion of the first lower wiring line within the chamfered VIA trench;

forming a dielectric film layer upon the vertical sidewall and the chamfered surface within the chamfered VIA trench and within the upper wiring line trench;

removing monolayer from the VIA trench to re-expose the portion of the lower wiring line retaining the dielectric film layer upon the vertical sidewall, upon the chamfered surface within the VIA trench, and upon the portion of the lower wiring layer between the first wiring line and the second wiring line, wherein removing the monolayer from the chamfered VIA trench comprises forming a sacrificial plug upon the dielectric film layer and upon the monolayer within the chamfered VIA trench and simultaneously removing the sacrificial plug and monolayer from the chamfered VIA trench; and forming a chamfered VIA within the chamfered VIA trench upon the re-exposed portion of the first lower wiring line and upon the portion of the lower wiring layer between the first wiring line and the second wiring line.

8. The fabrication method of claim 7, wherein the chamfered VIA comprises a vertical sidewall, a contact surface connected to the re-exposed portion of the first lower wiring line and connected to the portion of the lower wiring layer between the first wiring line and the second wiring line, and a chamfer that connects the vertical sidewall with the contact surface.

9. The fabrication method of claim 7, further comprising:
forming an upper wiring line upon the dielectric film within the upper wiring line trench, wherein the chamfered VIA connects the first lower wiring line and the upper wiring line.

10. The fabrication method of claim 7, wherein the chamfered VIA is offset from the first lower wiring line.

11. The fabrication method of claim 7, wherein the chamfered VIA is in line with the first lower wiring line.

12. The fabrication method of claim 7, wherein the monolayer is a one molecule thick layer.

* * * * *